(12) United States Patent
Lee et al.

(10) Patent No.: US 12,343,954 B2
(45) Date of Patent: Jul. 1, 2025

(54) APPARATUS AND METHOD FOR MANUFACTURING PHASE MASKS FOR LENS-LESS CAMERA

(71) Applicants: INDUSTRY-ACADEMIC COOPERATION FOUNDATION, YONSEI UNIVERSITY, Seoul (KR); UNIVERSITY-INDUSTRY COOPERATION GROUP OF KYUNG HEE UNIVERSITY, Yongin-si (KR)

(72) Inventors: Seung Ah Lee, Seoul (KR); Kyung Chul Lee, Yongin-si (KR); Nak Kyu Baek, Seoul (KR); Wook Park, Suwon-si (KR); Jung Hyun Bae, Yongin-si (KR); Jaewoo Jung, Seoul (KR)

(73) Assignees: INDUSTRY-ACADEMIC COOPERATION FOUNDATION, YONSEI UNIVERSITY, Seoul (KR); UNIVERSITY-INDUSTRY COOPERATION GROUP OF KYUNG HEE UNIVERSITY, Seoul (KR)

( * ) Notice: Subject to any disclaimer, the term of this patent is extended or adjusted under 35 U.S.C. 154(b) by 676 days.

(21) Appl. No.: 17/733,114

(22) Filed: Apr. 29, 2022

(65) Prior Publication Data
US 2022/0347952 A1 Nov. 3, 2022

(30) Foreign Application Priority Data

Apr. 30, 2021 (KR) .................. 10-2021-0056273
Apr. 15, 2022 (KR) .................. 10-2022-0046721

(51) Int. Cl.
| | | |
|---|---|---|
| *B29D 11/00* | (2006.01) | |
| *G02B 5/02* | (2006.01) | |
| *H10F 39/00* | (2025.01) | |

(52) U.S. Cl.
CPC .. *B29D 11/00961* (2013.01); *B29D 11/00788* (2013.01); *B29D 11/00798* (2013.01);
(Continued)

(58) Field of Classification Search
CPC ........ B29D 11/00961; B29D 11/00788; B29D 11/00798; G02B 5/0221; G02B 5/0268;
(Continued)

(56) References Cited

U.S. PATENT DOCUMENTS

| | | | | |
|---|---|---|---|---|
| 5,759,724 A | * | 6/1998 | Rolson ................... | G03F 1/28 430/323 |
| 6,544,694 B2 | * | 4/2003 | Dirksen ................... | G03F 1/36 430/5 |

(Continued)

FOREIGN PATENT DOCUMENTS

JP 2018505617 A 2/2018

OTHER PUBLICATIONS

"Design and High-Throughput Fabrication of Custom Phase-Masks for Lensless Cameras". by Kyung Chul Lee. Junghyun Bae. Nakkyu Baek, Jaewoo Jung, Wook Park, Seung Ah Lee. Mar. 5, 2022. SPIE OPTO, 2022 San Francisco, CA.

(Continued)

*Primary Examiner* — Hung V Nguyen (57) ABSTRACT

An apparatus for manufacturing phase masks for lens-less camera includes: a light source; a digital image mirror that receives a two-dimensional map, reflects the light irradiated from the light source with different intensities for each location and outputs reflected light; a two-dimensional map generator for generating the 2D map for adjusting the
(Continued)

intensity of reflected light for each position such that the phase mask has a unique pattern of a different height for each position from a point spread function acquired in advance depending on the purpose of use of the phase mask; and a material holder on which a photo-curable film is disposed that is irradiated with the reflected light and cured to different depths depending on the light intensity for each position of the irradiated reflected light.

20 Claims, 6 Drawing Sheets

(52) U.S. Cl.
CPC ......... *G02B 5/0221* (2013.01); *G02B 5/0268* (2013.01); *G02B 5/0278* (2013.01); *H10F 39/806* (2025.01)

(58) Field of Classification Search
CPC .. G02B 5/0278; G02B 13/0055; H10F 39/806
See application file for complete search history.

(56) References Cited

U.S. PATENT DOCUMENTS

| | | | |
|---|---|---|---|
| 8,974,987 B2* | 3/2015 | Nagai | G03F 1/68 430/5 |
| 10,018,523 B2* | 7/2018 | Wang | G01D 5/35316 |

OTHER PUBLICATIONS

Vivek Boominathan et al., PhlatCam: Designed Phase-Mask Based Thin Lensless Camera. IEEE Transactions on Pattern Analysis and Machine Intelligence. IEEE. vol. 42, No. 7, pp. 1618-1629.

* cited by examiner

APPARATUS AND METHOD FOR MANUFACTURING PHASE MASKS FOR LENS-LESS CAMERA

CROSS-REFERENCE TO RELATED APPLICATIONS

This application claims priority under 35 U.S.C. 119(a) to Korean Patent Application No. 10-2022-0046721, filed on Apr. 15, 2022, and Korean Patent Application No. 10-2021-0056273, filed on Apr. 30, 2021, in the Korean Intellectual Property Office, the disclosures of which are incorporated herein in their entireties by reference.

BACKGROUND

1. Technical Field

The present disclosure relates to an apparatus and method for manufacturing phase masks, more particularly to an apparatus and method for manufacturing phase masks for lens-less camera.

2. Description of the Related Art

A general camera is a lens camera, in which a lens is disposed in a direction in which light is incident, and a point light source in each scene is imaged in the form of a point on an image sensor through the lens, thereby acquiring an image.

On the other hand, in a lens-less camera, an amplitude mask or a phase mask that replaces a lens is disposed in a direction in which light is incident, and an incident point light source is modulated by the mask and imaged on an image sensor. Such a method of acquiring an image without including a lens is called a lens-less imaging method, and recently, research on a lens-less camera using a phase mask is being actively conducted.

The phase mask is more efficient in terms of light collection than the amplitude mask. In addition, it is characterized by imaging based on a unique pattern having shift-invariance characteristics. Therefore, the phase mask-based lens-less imaging has the advantage of being able to provide a more robust imaging model than the amplitude mask-based lens-less imaging.

In the phase mask-based lens-less imaging, each point light source constituting a scene is spread-modulated, while passing through the phase mask, according to a unique pattern formed on the phase mask to form an image on the image sensor. In this case, the unique pattern displayed by the point light source passing through the phase mask is referred to as a point spread function (PSF). In addition, the image acquired by being imaged on the image sensor can be restored to the same scene image as in lens imaging by using the point spread function (PSF), which is a unique pattern of the phase mask. That is, if the unique pattern of the phase mask is known, the original scene image can be restored from the image captured by the phase mask-based lens-less camera.

Such a lens-less camera is being used in various fields such as light focusing Augmented Reality (AR), Virtual Reality (VR), and acquiring a spectral image or a polarized image, and can be implemented inexpensively with a small and simple structure compared to a general lens-based camera. However, the point spread function (PSF) must have a pattern suitable for the purpose of use. That is, various patterns are required in which the size, density or the like of the pattern is adjusted depending on the purpose of use. However, since it is not easy to individually manufacture the phase masks having various patterns different from each other depending on each application, the manufacturing cost of the phase mask increases. Accordingly, there is a need for a method of manufacturing a phase mask capable of easily manufacturing various phase masks having various patterns of point spread functions (PSFs) according to the use at low cost.

SUMMARY

An object of the present disclosure is to provide an apparatus and method for manufacturing a phase mask capable of quickly and easily manufacturing a phase mask having various patterns.

Another object of the present disclosure is to provide an apparatus and method for manufacturing a phase mask capable of manufacturing a phase mask at low cost.

Another object of the present disclosure is to provide an apparatus and method for manufacturing a phase mask that can be directly manufactured on an image sensor.

An apparatus for manufacturing a phase mask according to an embodiment of the present disclosure, conceived to achieve the objectives above, comprises: a light source; a digital image mirror that receives a two-dimensional map (2D map), reflects the light irradiated from the light source with different intensities for each position and outputs reflected light; a two-dimensional map generator (2D map generator) for generating the 2D map for adjusting the intensity of reflected light for each position such that the phase mask has a unique pattern of a different height for each position from a point spread function acquired in advance depending on the purpose of use of the phase mask; and a material holder on which a photo-curable film is disposed that is irradiated with the reflected light and cured to different depths depending on the light intensity for each position of the irradiated reflected light.

The 2D map generator may repeat processes of estimating a virtual point spread function by calculating a phase change of a light passing through a virtual phase mask having a height for each position according to the previously set height map, and of updating the height map of the virtual phase mask by reflecting the error between the virtual point spread function and the required point spread function as a phase change of light back in the reverse direction.

If the error between the virtual point spread function and the point spread function is within a reference error, the 2D map generator may designate the height map of the virtual phase mask as a unique pattern of the phase mask according to the point spread function.

The 2D map generator may repeat processes of estimating a virtual point spread function, which is an image formed at a position spaced apart by a focal length by the light passing through the phase mask, using a phase map indicating the phase change of light passing through the virtual phase mask based on the height map of the virtual phase mask, of calculating the error between the virtual point spread function and the acquired point spread function, of, if the calculated error exceeds the reference error, updating the phase map by calculating the calculated error as a phase change of light in the reverse direction, and of updating the height map of the virtual phase mask based on the updated phase map.

The 2D map generator may perform filtering such that the phase change between adjacent positions according to the updated phase map is limited, and then convert it into an updated height map.

The 2D map generator may calculate the calculated error as a phase error according to the phase change of light, normalize the calculated phase error based on the maximum value of an optical transfer function in which the phase change of light passing through the phase mask is modeled, and update the phase map by compensating the phase map with the normalized phase error.

The 2D map generator may acquire the 2D map by quantizing a height map designated as a unique pattern of the phase mask.

The apparatus for manufacturing a phase mask may further include an objective lens for focusing the reflected light on a designated area of the photo-curable film.

The material holder may include a transparent plate on one surface of which the photo-curable film is disposed, and through the other surface of which the light reflected through the objective lens is incident; and PDMS disposed on the photo-curable film.

The material holder may include PDMS on one surface of which the photo-curable film is disposed, and through the other surface of which the light reflected through the objective lens is incident; and an image sensor disposed on the photo-curable film, wherein the objective lens may adjust the focus such that the energy of the reflected light passes through the PDMS and is concentrated in a region adjacent to the image sensor.

A method for manufacturing a phase mask according to an embodiment of the present disclosure, conceived to achieve the objectives above, comprises the steps of: by a 2D map generator including one or more processors, generating a 2D map for adjusting an intensity for each position of reflected light such that the phase mask has a unique pattern of different height for each position from the point spread function acquired in advance depending on the purpose of use of the phase mask; by a digital image mirror, receiving the 2D map, reflecting a light irradiated from a light source with different intensities for each position to output a reflected light; and irradiating the reflected light to a photo-curable film disposed on a material holder, thereby acquiring the phase mask having a different height for each position depending on the light intensity for each position of the reflected light.

Accordingly, the apparatus and method for manufacturing a phase mask, according to an embodiment of the present disclosure, can generate a 2D map that is a 2D image that determines an intensity of light such that the height of the phase mask is adjusted differently for each position according to the pattern of the point spread function of the phase mask, and manufacture a phase mask quickly and easily at low cost by irradiating light to a photo-curable material based on the generated 2D map. Therefore, it is possible to rapidly manufacture various phase masks having a point diffusion function according to the use, as well as mass-produce them. In addition, since the phase mask may be directly manufactured on the image sensor, the phase mask may be implemented integrally with the image sensor.

DETAILED DESCRIPTION

Hereinafter, a specific embodiment will be described with reference to the drawings. The following detailed description is provided to aid in a comprehensive understanding of the methods, apparatus and/or systems described herein. However, this is only an example, and the disclosed embodiments are not limited thereto.

In describing the embodiments, when it is determined that a detailed description of related known technologies related to the present disclosure may unnecessarily obscure the subject matter of the disclosed embodiments, a detailed description thereof will be omitted. In addition, terms to be described later are terms defined in consideration of functions in the present disclosure, which may vary according to the intention or custom of users or operators. Therefore, the definition should be made based on the contents throughout this specification. The terms used in the detailed description are only for describing embodiments, and should not be limiting. Unless explicitly used otherwise, expressions in the singular form include the meaning of the plural form. In this description, expressions such as "comprising" or "including" are intended to refer to certain features, numbers, steps, actions, elements, some or combination thereof, and it is not to be construed to exclude the presence or possibility of one or more other features, numbers, steps, actions, elements, parts or combinations thereof, other than those described. In addition, terms such as "unit", "device", "module", "block", and the like described in the specification refer to units for processing at least one function or operation, which may be implemented by hardware, software, or a combination of hardware and software.

Figure 1:
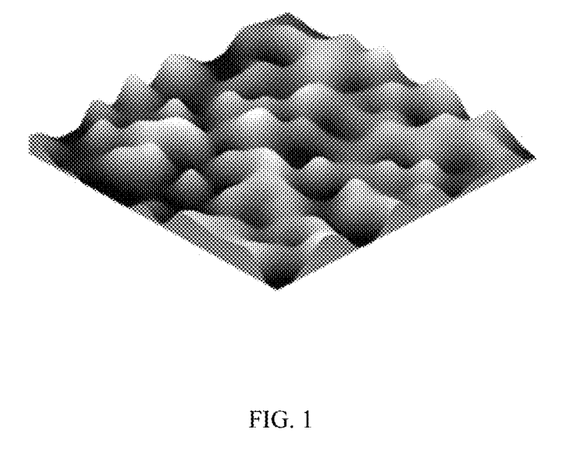
FIGS. 1 and 2 show an example of a phase mask and a point spread function.
Figure 2:
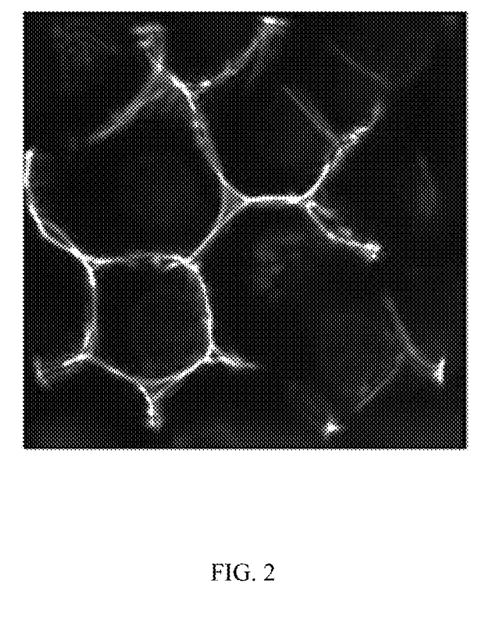

FIG. 1 and FIG. 2 show an example of a phase mask and a point spread function.

FIG. 1 shows a phase mask, and FIG. 2 shows a point spread function (PSF) for the phase mask of FIG. 1.

As shown in FIG. 1, the phase mask has a unique pattern formed in a curved shape having different heights for each position on one surface of a transparent material flat plate through which light can pass. By this unique pattern, the light passing through the phase mask is spread-modulated by changing the phase differently depending on the incident position, so that as shown in FIG. 2, a unique image according to the unique pattern is formed in a direction opposite to the direction in which the light is incident. At this time, the unique image appears blurred or clear depending on the distance between the phase mask and the imaging plane (usually the image sensor) on which the image is formed, the distance between the phase mask and the imaging plane in which the unique image appears most clearly is called the focal length (f), and the unique image shown at the focal length (f) is called the point spread function (PSF).

As described above, the point spread function (PSF) is used to restore an original scene from an image acquired by a lens-less camera, and the point spread function (PSF) should be formed in various patterns depending on the purpose of use of the lens-less camera. That is, the unique patterns of different curved shapes for each position formed on the phase mask should not only be different from each other depending on the use, but also the corresponding point spread functions (PSF) should all be checked.

In the case of the conventional method for manufacturing a phase mask according to a use, a phase mask having a schematic (rough) unique pattern according to the use was firstly manufactured in most cases for the convenience of manufacturing, and the point spread function (PSF) was checked by irradiating light to the manufactured phase mask. And, when the point spread function (PSF) does not have a required pattern, the unique pattern of the phase mask was modified and the point spread function (PSF) was checked again. At this time, the phase mask uses an imprint method of forming a mold of a unique pattern on another material that is easy to form a pattern, and placing the formed mold on a material constituting the phase mask and pressing it to form a unique pattern of the phase mask, a 3D print method using a 3D printer, or the like.

However, in the case of the imprint method, although suitable for mass production of phase masks having the same unique pattern, it is not suitable for manufacturing phase masks having various different unique patterns, in order to implement different point spread functions (PSF) depending on the use. Moreover, even if the manufactured phase mask needs to be modified for reasons such as not exhibiting the required point spread function (PSF), a new mold must first be produced, which causes a significant increase in manufacturing cost.

In addition, in the case of the 3D print method, although there is an advantage that the phase mask can be easily manufactured by inputting the unique pattern data of the phase mask, there is a limitation in that the cost of the 3D printer itself is very expensive, and it is difficult to form a unique pattern that smoothly changes in height depending on the position, and fast manufacturing is difficult due to the characteristics of the manufacturing method.

Accordingly, in this embodiment, a phase mask corresponding to the point diffusion function (PSF) is manufactured using light and a photo-curable material.

Figure 3:
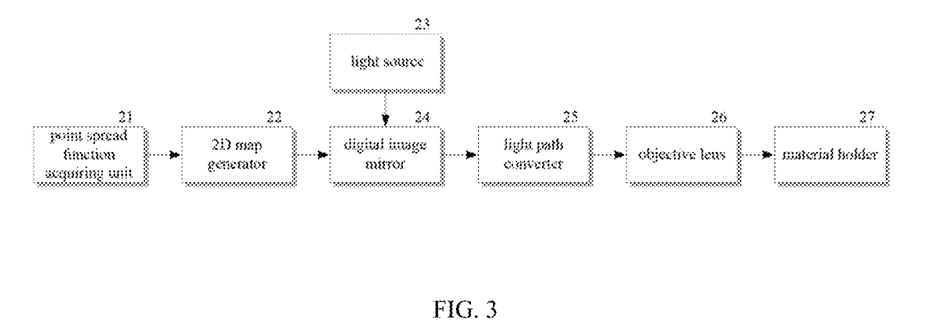
FIG. 3 shows an apparatus for manufacturing a phase mask according to an embodiment, which is divided according to the operation to be performed.
Figure 4:
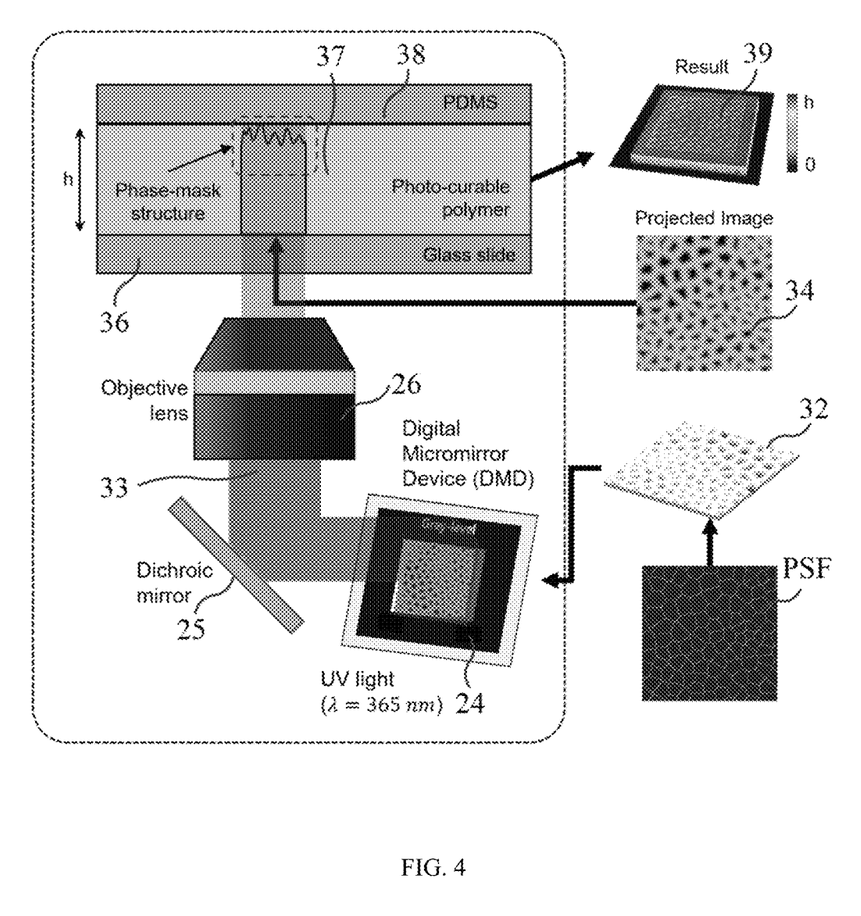
FIG. 4 shows an example of an apparatus for designing a phase mask.

FIG. 3 shows an apparatus for manufacturing a phase mask according to an embodiment, which is divided according to the operation to be performed, and FIG. 4 shows an example of an apparatus for designing a phase mask.

Referring to FIG. 3, the apparatus for manufacturing a phase mask according to an embodiment may include a point spread function acquiring unit 21, a 2D map generator 22, a light source 23, a digital image mirror 24, a light path converter 25, an objective lens 26 and a material holder 27.

In the embodiment shown in FIG. 3, each component of the apparatus for manufacturing a phase mask may have different functions and capabilities other than those described below, and may include additional components other than those described below. In addition, in one embodiment, each component may be implemented using one or more physically separated devices, or implemented by one or more processors or a combination of one or more processors and software, and may not be clearly distinguished in a specific operation unlike the illustrated example.

The point spread function acquiring unit 21 acquires a point spread function (PSF) having a pattern according to the purpose of use of the phase mask. As shown in FIG. 2, the point spread function (PSF) may be acquired as 2D image data having a variety of different patterns. The point spread function acquiring unit 21 may be implemented with a storage medium such as a memory in which a point spread function (PSF), which is 2D image data, is stored, or implemented with a communication module or the like that receives a point spread function (PSF) through a wired or wireless network, or may be implemented with other components.

When the point spread function acquiring unit 21 acquires the point spread function, the 2D map generator 22 generates a 2D map 32 for acquiring a phase mask on one surface of which a 3D height curve pattern is formed from a 2D point spread function (PSF). Although the point spread function (PSF) is a 2D image that matches a 3D unique pattern formed on one surface of the phase mask, it is an image showing the result of light incident on the phase mask, spread-modulated, and imaged on the imaging plane. Therefore, it is difficult to directly manufacture a phase mask having a 3D unique pattern from the point spread function (PSF). Accordingly, in the embodiment, a 2D map 32 as shown in FIG. 4 is generated as an intermediate image for forming a 3D unique pattern of a phase mask from a 2D point spread function (PSF).

Here, the 2D map 32 is image data in which 3D height information is expressed as a value in two dimensions based on a point spread function (PSF), and in the present embodiment, the 2D map generator 22 may generate, for example, a 2D grayscale map as the 2D map 32. As described above, in the present embodiment, the apparatus for manufacturing a phase mask may manufacture a phase mask based on light and a photo-curable material, and the 2D map 32 generated as a grayscale map may operate as a light intensity filter for adjusting the intensity of light irradiated to the photo-curable material for each position, such that different height differences are generated in the photo-curable material for each position. However, this is just an example, and the 2D map generator 22 may generate the 2D map 32 in a different form depending on the method for manufacturing a phase mask.

The light source 23 irradiates light to the digital image mirror 24. The light source 23 generates light having a designated wavelength and irradiates it to the digital image mirror 24. Here, as an example, it is assumed that a photo-curable element implemented as a phase mask is a UV photo-curable element, and thus the light source 23 may emit ultraviolet (UV) light.

The digital image mirror 24 receives the 2D map 32 generated by the 2D map generator 22, and reflects the incident light irradiated from the light source 23 according to the received 2D map 32. In this case, the digital image mirror 24 may reflect it such that the intensity of the reflected light 33 is different for each position. The digital image mirror 24 may be implemented including a plurality of micro-mirrors, and each of the plurality of micro-mirrors may adjust the light intensity for each position of the incident reflected light 33 according to the pixel value of the corresponding position on the 2D map 32. The digital image mirror 24 may be implemented with, for example, a digital micro-mirror device (DMD).

The light path converter 25 adjusts the angle such that the reflected light 33 incident from the digital image mirror 24 is incident on the objective lens 26, and reflects it again. The light path converter 25 may be implemented with, for example, a dichroic mirror. The light path converter 25 only serves to change the path such that the reflected light 33 reflected from the digital image mirror 24 is incident on the objective lens 26, and thus may be omitted in some cases.

When the reflected light 33 reflected from the digital image mirror 24 is applied, the objective lens 26 focuses the applied reflected light 33 on a designated area of the photo-curable film 37 disposed on the material holder 27. At this time, since the reflected light 33 focused on the photo-curable film 37 has a pattern of the projected image 34 by the 2D map 32 from the digital image mirror 24, it is incident with different light intensity for each position. On the material holder 27, a photo-curable film 37 to be cured by the reflected light 33 is disposed, wherein the photo-curable film 37 may be made of a photo-curable polymer or the like, which is a kind of photo-curable material. In addition, the material holder 27 may include a transparent plate (e.g. a glass slide) 36 on which a photo-curable film 37 is disposed and through which light can pass, and a polydimethylsiloxane (PDMS) 38 disposed on the photo-curable film 37.

The reflected light 33 having a different light intensity for each position and focused by the objective lens 26 passes through the transparent plate 36 and is incident on the photo-curable film 37, and the photo-curable film 37 is cured to a depth according to the light intensity of the incident reflected light 33. At this time, since the intensity of the reflected light 33 is different for each position according to the 2D map 32, the photo-curable film 37 is cured to have a different height for each position. In addition, since the height difference for each position of the photo-curable film 37 was determined by the 2D map 32, and the 2D map 32 was acquired from the point spread function (PSF), it can be seen that the photo-curable film 37 has a height for each position corresponding to the point spread function (PSF). That is, the photo-curable film 37 may be acquired with a phase mask 39 having a 3D unique pattern according to a point spread function (PSF). At this time, light may be also irradiated to the peripheral region of the phase mask 39 so that, as shown in FIG. 4, unnecessary margin regions may be cured together. In this case, by removing the margin regions by a separate process, the phase mask 39 having a required size and unique pattern can be acquired.

The objective lens 26 can adjust the position where the phase mask 39 is formed by adjusting the focal position where light energy is concentrated in the photo-curable film 37. Here, as an example, it is assumed that the objective lens 26 causes energy to be concentrated on the transparent plate 36 so that the phase mask 39 is acquired on the transparent plate 36.

As a result, the apparatus for manufacturing a phase mask shown in FIGS. 2 and 3 can acquire a 2D map 32 that is 2D digital image data corresponding to a point spread function (PSF), and based on the acquired 2D map 32, easily manufacture the phase mask 39 with only one light irradiation by adjusting the intensity of incident light differently for each position and reflecting it on a photo-curable material. Accordingly, it is possible to easily produce various phase masks 39 for each of the point spread functions (PSF) of various patterns according to the use, as well as perform mass production. In addition, it is possible to manufacture the phase mask 39 in which the height for each position is smoothly changed.

However, in order to manufacture the phase mask 39 corresponding to the point spread function (PSF) with the apparatus for manufacturing a phase mask, the 2D map 32 including height information of the phase mask to be manufactured must be accurately generated. Hereinafter, a method of acquiring the 2D map 32 from the point spread function (PSF) will be described, and for convenience of understanding, the difference between the lens-based imaging method and the phase mask-based lens-less imaging method will be first described.

Figure 5:
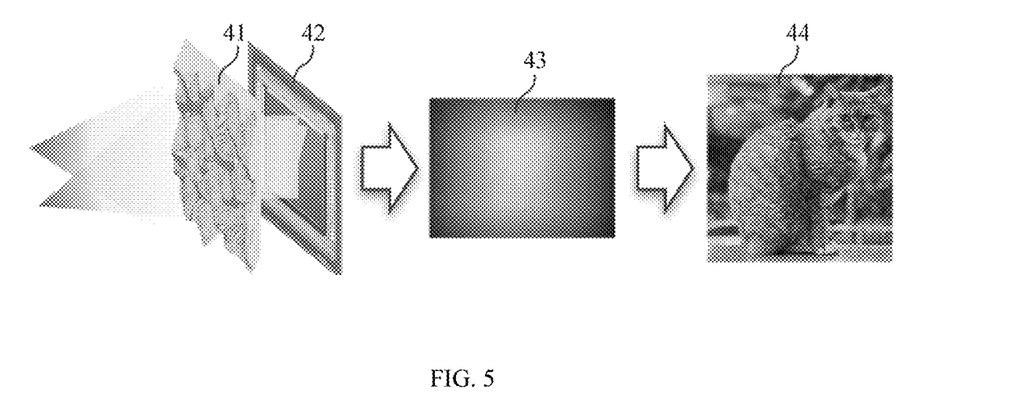
FIG. 5 is a diagram for explaining an operation of a phase mask-based lens-less imaging method.
Figure 6:
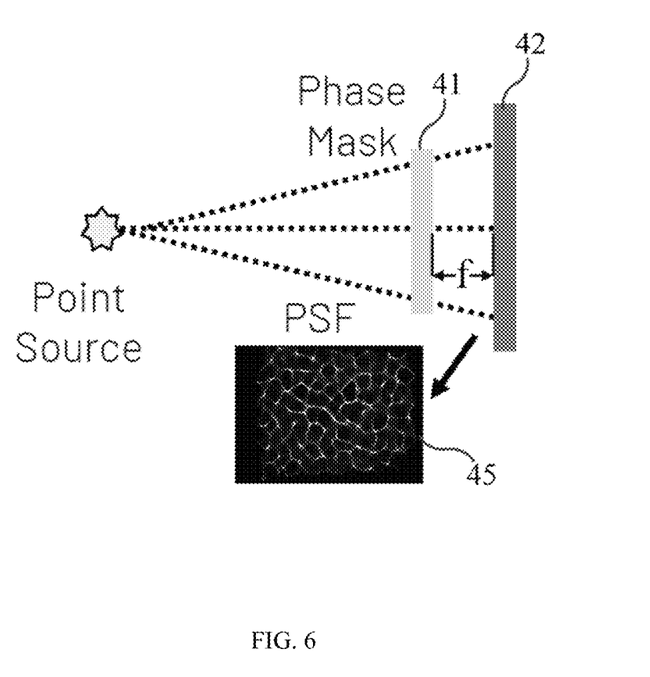
FIGS. 6 and 7 are a diagram for explaining the principle of a phase mask-based lens-less imaging method.
Figure 7:
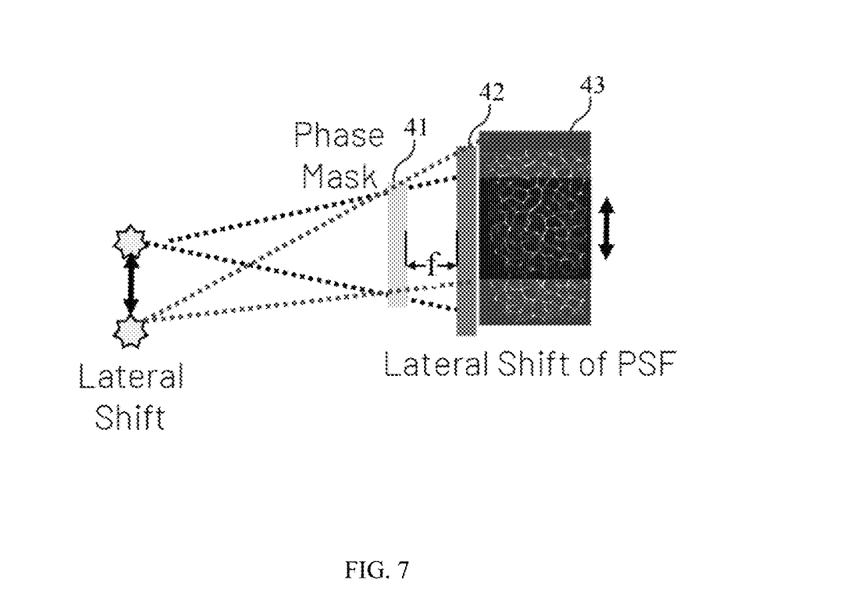

FIG. 5 is a diagram for explaining an operation of a phase mask-based lens-less imaging method, and FIGS. 6 and 7 are a diagram for explaining the principle of a phase mask-based lens-less imaging method.

In the phase mask-based lens-less imaging method, as shown in FIG. 5, instead of a lens module in the lens imaging method, a phase mask 41 is arranged spaced apart from the front of the image sensor 42. In addition, on one surface of the phase mask 41, a unique pattern having an irregular size, height, shape, etc. for each position is formed. Since the unique pattern formed on one surface of the phase mask 41 causes a phase change by delaying the transmitted light differently for each position, it may also be referred to as a phase shift pattern.

Since a lens for focusing the point light source is not included in the lens-less camera, a point light source that is diffusely incident on the phase mask 41 is converted into a pattern according to the phase shift pattern and is incident on the image sensor 42. That is, an image in which the point light source spreads over the entire area of the image sensor according to the phase shift pattern formed on the phase mask 41 is acquired. At this time, when the phase mask 41 is spaced apart from the image sensor 42 by the focal length (f), a point spread function (PSF) 45 having the sharpest pattern of the light modulated by the phase mask 41 appears.

When an object having a size other than a point is photographed in the phase mask-based lens-less imaging method, that is, when a scene is photographed, as shown in FIG. 7, it can be seen that the lights emitted from a plurality of point light sources for each position of the scene overlap and are incident through the phase mask 41 on the image sensor 42. Accordingly, the point spread function (PSF) projected to the image sensor is shifted as a whole according to the position of each point light source. Therefore, when a scene is photographed, since a plurality of point spread functions (PSF) are shifted and overlapped and incident on the image sensor 42 by a plurality of point light sources constituting a scene, the image sensor 42 acquires a raw image 43 as shown in FIG. 5.

In addition, the raw image 43 acquired from the image sensor 42 using the lens-less imaging method may be converted into an image having the same shape as that of the lens-based imaging method by performing an inverse operation using the point spread function (PSF) again. In some cases, it may be converted into an image of a lens-based imaging method by applying an optimization technique, which is a known technique and, therefore, will not be described in detail here.

As such, the phase mask 41 is formed in a 3D shape structure having one surface having a different height for each position according to a unique pattern. In addition, the phase shift pattern of the phase mask 41 having a 3D shape structure corresponds to a point spread function (PSF) having a 2D pattern. A point spread function (PSF), which is a 2D pattern, can be easily estimated from the 3D phase shift pattern of the phase mask 41. In contrast, it is not easy to determine the phase shift pattern of the phase mask 41 having a 3D shape structure from the point spread function (PSF) having a 2D pattern. This is because, in the case of dimensional expansion from 2D to 3D, innumerable phase shift patterns of the phase mask 41 corresponding to the point spread function (PSF) are derived and cannot be specified as one pattern.

Hereinafter, the 2D map generator 22 for generating the 2D map 32 from the point spread function (PSF) will be described in detail.

Figure 8:
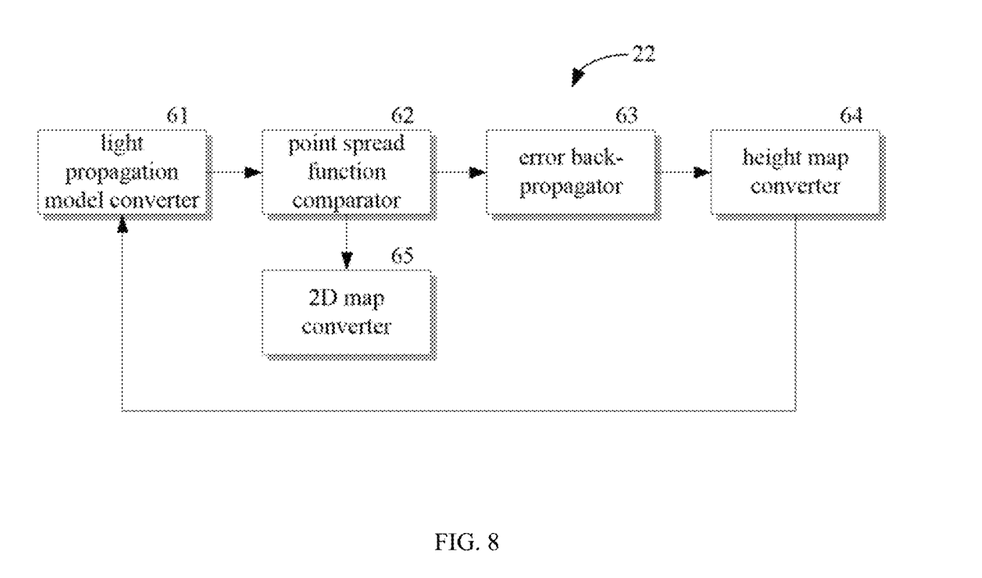
FIG. 8 shows an example of a configuration of the 2D map generator of FIG. 3, which is divided according to the operation to be performed.

FIG. 8 shows an example of a configuration of the 2D map generator of FIG. 3, which is divided according to the operation to be performed.

Referring to FIG. 8, the 2D map generator 22 may include a light propagation model converter 61, a point spread function comparator 62, an error back-propagator 63, a height map converter 64, and a 2D map converter 65.

Also in FIG. 8, each of the components of the 2D map generator 22 may have different functions and capabilities other than those described below, and may include additional components other than those described below. In addition, in one embodiment, each component may be implemented using one or more physically separated devices, or implemented by one or more processors or a combination of one or more processors and software, and may not be clearly distinguished in a specific operation unlike the illustrated example.

In addition, the 2D map generator 22 shown in FIG. 8 may be implemented in a logic circuit by hardware, firmware, software, or a combination thereof, or may be implemented using a general-purpose or special-purpose computer. The apparatus may be implemented using a hardwired device, a field programmable gate array (FPGA), an application specific integrated circuit (ASIC), or the like. In addition, the apparatus may be implemented as a system on chip (SoC) including one or more processors and controllers.

The 2D map generator 22 may be mounted in the form of software, hardware, or a combination thereof on a computing device or server provided with hardware elements. The computing device or server may refer to various devices including all or part of a communication device such as a communication modem for communicating with various devices or wired and wireless communication networks, a memory for storing data for executing programs, a processor for executing programs to operate and instruct, or the like.

The light propagation model converter 61 receives an initial height map or a previously acquired height map, and estimates virtual point spread function according to the focal length (f) between the virtual phase mask and the image sensor using a light propagation model.

Here, the height map is a map indicating a height for each position of the unique pattern formed on the phase mask, and is a 2D image map having a height of a pattern at each position as a pixel value in a virtual phase mask on one surface of which a pattern having different heights for each position are formed. In this case, the initial height map may be set to a pre-designated value or set randomly.

When the height map is applied, the light propagation model converter 61 interprets it as a light propagation model in consideration of the medium characteristics according to the material implementing the phase mask and the medium characteristics between the phase mask and the image sensor, thereby estimating a virtual point spread function in which light passes through a virtual phase mask based on the current height map and is imaged on the image sensor. The light propagation model is an algorithm used in wave optics designed to analyze the shape of light propagation in a given environment, and as an example, an angular spectrum model may be used.

However, it is difficult to estimate the virtual point spread function directly from the height map, and accordingly, the light propagation model converter 61 first acquires a phase map indicating a phase change of incident light from a height map indicating a height for each position physically, and estimates a virtual point spread function using the acquired phase map. Here, the light propagation model converter 61 may perform a Fourier transform on the height map to acquire a phase map on the Fourier domain. And when the light passing through the virtual phase mask is imaged at the focal length (f), an optical transfer function representing a change in the Fourier domain is acquired using a light propagation model, and the phase of the light at the focal length (f) is calculated according to the acquired optical transfer function.

At this time, since the phase of light is a result acquired in the Fourier domain, the light propagation model converter 61 may acquire a virtual point spread function by performing inverse Fourier transform again on the phase of light for each position at the focal length (f).

When the virtual point spread function is acquired from the light propagation model converter 61, the point spread function comparator 62 calculates an error between the acquired virtual point spread function and the point spread function (PSF) acquired in advance according to the use. And if the calculated error is within a pre-designated reference error, the currently set height map is determined as a unique pattern of the phase mask corresponding to the point spread function (PSF), and the determined height map is transmitted to the 2D map converter 65. However, if the error exceeds the reference error, the virtual point spread function and the point spread function (PSF) are transmitted to the error back-propagator 63.

The error back-propagator 63 acquires an error-compensated height map from an error between the virtual point spread function and the point spread function (PSF). However, as in the light propagation model converter 61, it is difficult to acquire a compensation value for each position of the height map directly from the error between the virtual point spread function and the point spread function (PSF). Accordingly, the error back-propagator 63 calculates the error between the virtual point spread function and the point spread function (PSF), which are 2D images, as a phase error back-propagated from the image sensor to the virtual phase mask in the Fourier domain. Then, the phase map is first updated by reflecting the calculated phase error in the phase map acquired by the light propagation model converter 61. That is, an updated phase map is acquired by back-propagating an error between the virtual point spread function formed in the image sensor and the point spread function (PSF) to be expressed as a phase error in the virtual phase mask. At this time, the error back-propagator 63 may update the phase map by normalizing the magnitude of the phase error and adding it to the phase map such that the phase error is reflected within the designated ratio in consideration of the maximum value of the optical transfer function designated by the light propagation model.

The height map converter 64 acquires an updated height map from the acquired updated phase map. As described above, since the updated phase map is a phase value in which an error in the Fourier domain is compensated, the updated phase map must be converted back into a height map in order to reflect it as a unique pattern of the phase mask. Accordingly, the height map converter 64 may acquire an updated height map by performing an inverse Fourier transform on the updated phase map. However, if the height map is updated by inverse Fourier transform of the phase map, there may be cases where it is not possible to manufacture an actual phase mask according to the updated height map.

As described above, when the phase mask is manufactured using the 2D map 32, a large difference in height for each position of the phase shift pattern cannot be generated. That is, there is a limit to the difference between the maximum height and the minimum height of the height map that can be manufactured by the apparatus for manufacturing a phase mask shown in FIG. 4. Also, the height change should be smooth in the adjacent positions. Therefore, simply performing an inverse Fourier transform on the updated phase map to acquire an updated height map results in acquiring a theoretically feasible phase shift pattern, without considering the manufacturing process of the actual phase mask.

Accordingly, the height map converter 64 may additionally apply a filtering function according to the constraint of the phase mask manufacturing apparatus to the updated phase map, and then perform an inverse Fourier transform to acquire the height map. Here, the filtering function may be variously set according to a phase mask manufacturing technique, and, for example, a low pass filter function or a total variation function may be used.

When the height map converter 64 acquires the updated height map manufacturable by the apparatus for manufacturing a phase mask, the light propagation model converter 61 again acquires a virtual point spread function based on the updated height map, and the point spread function comparator 62 calculates an error between the virtual point spread function and the point spread function (PSF).

When the error between the virtual point spread function and the point spread function (PSF) is determined to be less than or equal to the reference error in the point spread function comparator 62, and the finally updated height map is applied as a unique pattern of the phase mask, the 2D map converter 65 acquires the 2D map 32 by quantizing a height value, i.e. a pixel value, according to the position coordinates of the applied height map to a designated number of bits (e.g. 8 bits). The 2D map converter 65 may acquire the 2D map 32 by, for example, quantizing the pixel value of each pixel of the 2D map to a value in gray scale.

And, as shown in FIG. 4, the acquired 2D map 32 is input to the digital image mirror 24, such that a unique pattern of the phase mask is formed by adjusting the light intensity for each position of the reflected light.

That is, the 2D map generator 22 repeats the processes of estimating a virtual point spread function in consideration of the phase change of light passing through the virtual phase mask based on the height map of the virtual phase mask, and of updating the height map of the virtual phase mask by reflecting the error between the estimated virtual point spread function and the required point spread function (PSF) as the phase change of light in the reverse direction, and if the error between the virtual point spread function and the required point spread function (PSF) is within the reference error, designates the height map of the virtual phase mask as a unique pattern of the phase mask according to the point spread function (PSF). In addition, it generates a 2D map 32 indicating the intensity of light to be incident for each position in order to form the designated unique pattern of a phase mask on the photo-curable film 37.

Figure 9:
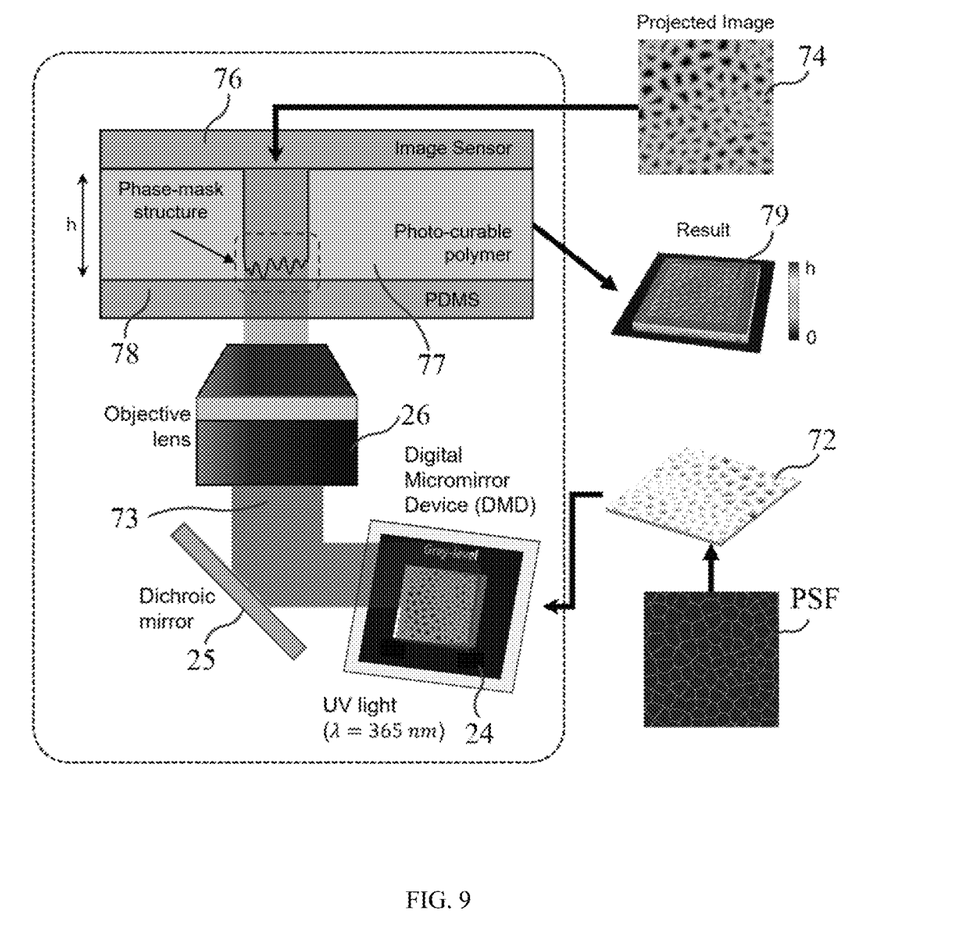
FIG. 9 shows another example of an apparatus for designing a phase mask.

FIG. 9 shows another example of an apparatus for designing a phase mask.

In the apparatus for designing a phase mask shown in FIG. 4, a phase mask 39 is formed and manufactured on the transparent plate 36. Therefore, when the manufactured phase mask 39 is actually used, as shown in FIGS. 4 and 5, the phase mask 41 should be disposed to be spaced apart from the image sensor 42 by a focal length (f). As such, when the image sensor 42 and the phase mask 41 should be disposed to be spaced apart, the phase mask-based lens-less camera should be provided with a separate phase mask support such as a spacer or the like for maintaining a gap between the image sensor 42 and the phase mask 41. In the case of a general lens-based camera, the focal length (f) must also be adjusted according to the distance from the scene to be photographed. That is, the distance between the image sensor and the lens should be able to change frequently. Therefore, the configuration of the support for adjusting the position of the lens is essential.

In contrast, in the phase mask-based lens-less camera, the focal length (f) has already been determined and designated when the phase mask 41 is manufactured. Although the focal length (f) may be set differently depending on the thickness and material of the phase mask 41 and the medium (e.g. air) existing between the phase mask 41 and the image sensor 42, once the thickness, material and medium of the phase mask 41 are determined, the focal length (f) does not change. Therefore, in the phase mask-based lens-less camera, the phase mask support is only used to maintain the distance between the image sensor 42 and the phase mask 41.

And even using the phase mask support, it requires many processes to separate the phase mask 41 from the image sensor 42 by a designated distance and fix it.

Accordingly, in FIG. 9, the phase mask 41 is directly formed integrally on the image sensor 42, such that it is possible to eliminate a separate process for disposing the phase mask 41 in the lens-less camera.

Also in FIG. 9, the apparatus for manufacturing a phase mask includes a light source 23, a digital image mirror 24, an light path converter 25, an objective lens 26 and a material holder 27. As in FIG. 4, the light source 23 irradiates light to the digital image mirror 24, and the digital image mirror 24 receives the 2D map 32 generated by the 2D map generator 22 and reflects the light applied from the light source 23 such that the intensity for each position is different. The light path converter 25 adjusts the angle such that the reflected light 33 incident from the digital image mirror 24 is incident on the objective lens 26, and reflects it again, and the objective lens 26 focuses the reflected light 73 on a designated area of the photo-curable film 77 disposed on the material holder 27. However, unlike in FIG. 4, the material holder 27 in FIG. 9 is provided with an image sensor 76 that replaces the transparent plate 36 together with PDMS 78, and a photo-curable film 77 is disposed between the PDMS 78 and the image sensor 76.

In FIG. 4, the transparent plate 36 is positioned in the direction of the objective lens 26, however since the reflected light 73 cannot pass through the image sensor 76 provided in place of the transparent plate 36, the PDMS 78 is disposed in the direction of the objective lens 26, and the image sensor 76 is disposed to be spaced apart from the PDMS 78 with the photo-curable film 77 interposed therebetween. The PDMS 78 is also a transparent material, and like the transparent plate 36, the reflected light 73 incident through the objective lens 26 can be transmitted therethrough.

Meanwhile, unlike in FIG. 4 in which the objective lens 26 adjusts the focal position such that the energy of the incident light is concentrated on the photo-curable film 37 around the transparent plate 36, in FIG. 9, the objective lens 26 adjusts the focal position such that the energy of the reflected light 73 is concentrated on the photo-curable film 37 around the image sensor 76. That is, the energy of the reflected light 73 is concentrated adjacent to the image sensor. For this reason, the reflected light 73 incident from the objective lens 26 to the material holder 27 cures the photo-curable film 77 on the image sensor 76 rather than on the PDMS 78. This allows the phase mask 79 to be formed directly on the image sensor 76. Although the energy of the reflected light 73 is concentrated in the direction of the image sensor 76, the reflected light 73 still has a different intensity for each position according to the 2D map 32, so the phase mask 79 is formed to have a height for each position corresponding to the point spread function (PSF).

As shown in FIG. 9, when the phase mask 79 is manufactured directly on the image sensor 76, no other medium exists between the phase mask 79 and the image sensor 76. Therefore, the focal length (f) can be calculated in consideration of only the material of the phase mask 79, and the thickness of the phase mask 79 can be determined and formed according to the calculated focal length (f).

As shown in FIG. 9, when the phase mask 79 is formed directly on the image sensor 76 with a thickness according to the focal length (f), the manufacturing process of a lens-less camera can be significantly reduced, making it possible to manufacture a lens-less camera at low cost. In addition, a clear raw image 43 can be acquired by maximally excluding a gap adjustment error between the phase mask 79 and the image sensor 76, etc.

Figure 10:
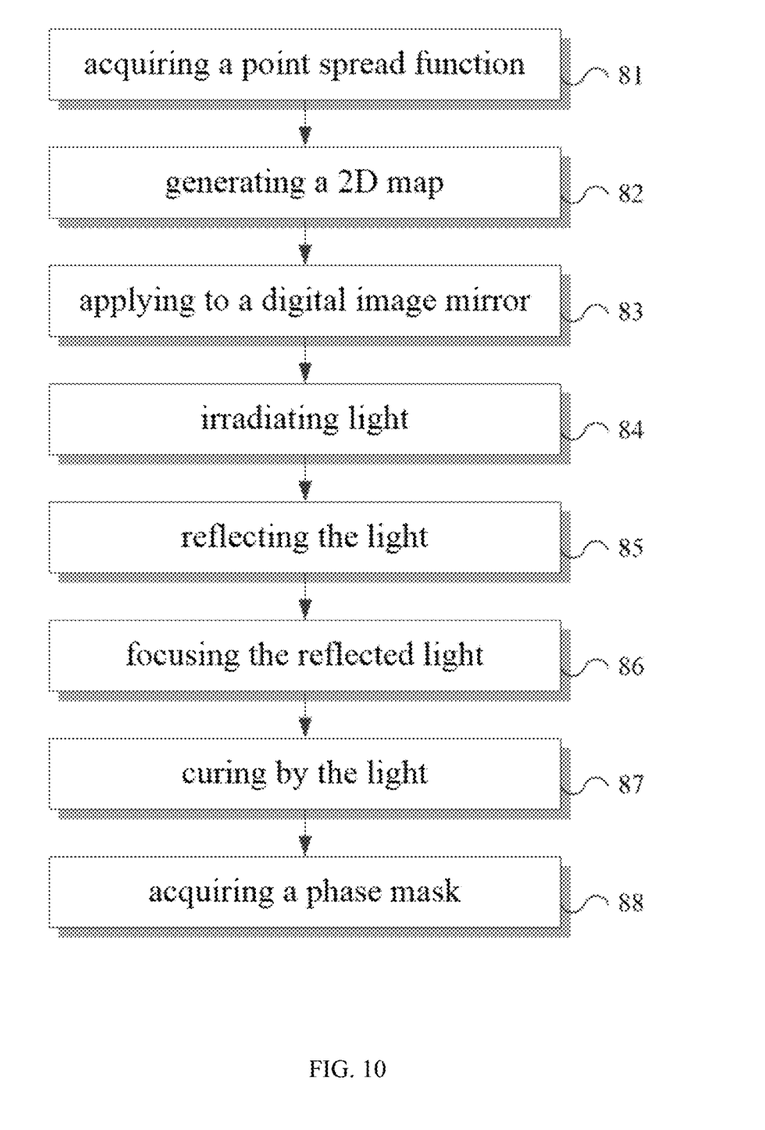
FIG. 10 shows a method for manufacturing a phase mask according to an embodiment.

FIG. 10 shows a method for manufacturing a phase mask according to an embodiment.

Referring to FIGS. 1 to 7, in the method for manufacturing a phase mask according to an embodiment, a point spread function (PSF) is first acquired according to a use (81). Since the point spread function (PSF) can be formed in various patterns depending on the purpose of use of the phase mask, in order to manufacture the phase mask, a point spread function (PSF) having a suitable pattern is first acquired in consideration of the purpose of use.

Then, a 2D map for forming a unique pattern of a phase mask according to a point spread function (PSF) is generated using light (82). Here, the 2D map is 2D image data for forming a unique pattern of a phase mask corresponding to a point spread function (PSF) by irradiating light on a photo-curable material, and is data for adjusting the intensity of light projected on the photo-curable film 37 disposed on the material holder 27 for each position.

In order to generate a 2D map from the point spread function (PSF), an initial height map in which the height for each position of the phase mask is arbitrarily set is created, and a phase map indicating a phase change of light when light is irradiated to a phase mask having a 3D pattern according to an initial height map is acquired using the light propagation model. Then, according to the acquired phase map, a virtual point spread function formed at the focal length (f) by the light irradiated to the phase mask is acquired, the phase map is updated according to the error between the acquired virtual point spread function and the point spread function (PSF), and the height map is updated based on the updated phase map. Thereafter, a 2D map for adjusting the intensity for each position of the light projected on the photo-curable film 37 can be acquired from the updated height map.

When the 2D map is acquired, the acquired 2D map 32 is applied to the digital image mirror 24 (83). Then, the light source 23 irradiates light toward the digital image mirror 24 (84).

The digital image mirror 24 reflects the light irradiated from the light source 23 with different intensities for each position according to the applied 2D map 32 (85). The reflected light reflected from the digital image mirror 24 is focused by the objective lens 26 and is incident on the photo-curable film 37 disposed on the material holder 27 (86). The photo-curable film 37 is cured to have different heights by the reflected light incident with different intensities for each position (87). That is, it is cured with a unique pattern corresponding to the point spread function (PSF). Accordingly, a phase mask is acquired by extracting the cured photo-curable film 37 having a unique pattern from the material holder 27 (88). At this time, the reflected light 33 may also be incident around the unique pattern so that the periphery of the unique pattern may also be cured, which can be removed as a margin region through a separate process.

The method for manufacturing a phase mask shown in FIG. 10 may be performed by the apparatus for manufacturing a phase mask of FIG. 3. In FIG. 10, it is disclosed that the respective processes are sequentially performed, but this is merely illustrative and those skilled in the art may apply various modifications and changes by changing the order illustrated in FIG. 10 or performing one or more processes in parallel or adding another process without departing from the essential gist of the exemplary embodiment of the present disclosure.

While the present disclosure has been described in detail with reference to representative embodiments, those skilled in the art will understand that various modifications and equivalent other embodiments are possible therefrom. Therefore, the true technical scope of the present disclosure is to be defined by the technical spirit set forth in the appended scope of claims.

What is claimed is:

1. An apparatus for manufacturing a phase mask for lens-less camera, comprising:
   a light source;
   a digital image mirror that receives a two-dimensional map (2D map), reflects light irradiated from the light source with different intensities for each position and outputs reflected light;
   a two-dimensional map generator (2D map generator) for pre-obtaining a point spread function indicating light intensity for each position to be formed on a 2D imaging plane placed at a focal distance, determining a height for each 2D position that the phase mask to be manufactured has from the pre-obtained point spread function, and generating the 2D map representing the intensity for each 2D position that the reflected light has according to the determined height for each 2D position; and
   a material holder on which a photo-curable film is disposed that is irradiated with the reflected light and cured to different depths depending on the light intensity for each position of the irradiated reflected light.

2. The apparatus of claim 1,
   wherein the 2D map generator repeats processes of:
   estimating a virtual point spread function by calculating a phase change of a light passing through a virtual phase mask having a height for each position according to a previously set height map, and
   updating the height map of the virtual phase mask by reflecting an error between the virtual point spread function and the point spread function as a phase change of light back in reverse direction.

3. The apparatus of claim 2,
   wherein, if the error between the virtual point spread function and the point spread function is within a reference error, the 2D map generator designates the height map of the virtual phase mask as a height of the phase mask for each 2D position according to the point spread function.

4. The apparatus of claim 3,
wherein the 2D map generator repeats processes of:
estimating a virtual point spread function, which is an image formed at a position spaced apart by a focal length by light passing through the phase mask, using a phase map indicating the phase change of the light passing through the virtual phase mask based on the height map of the virtual phase mask,
calculating the error between the virtual point spread function and the point spread function,
if the calculated error exceeds the reference error, updating the phase map by calculating the calculated error as a phase change of light in the reverse direction, and
updating the height map of the virtual phase mask based on the updated phase map.

5. The apparatus of claim 4,
wherein the 2D map generator performs filtering such that the phase change between adjacent positions according to the updated phase map is limited, and then convert it into an updated height map.

6. The apparatus of claim 5,
wherein the 2D map generator calculates the calculated error as a phase error according to the phase change of light, normalizes the calculated phase error based on the maximum value of an optical transfer function in which the phase change of the light passing through the phase mask is modeled, and updates the phase map by compensating the phase map with the normalized phase error.

7. The apparatus of claim 3,
wherein the 2D map generator acquires the 2D map by quantizing a height map designated as a height of the phase mask for each 2D position.

8. The apparatus of claim 1,
wherein the apparatus further includes an objective lens for focusing the reflected light on a designated area of the photo-curable film.

9. The apparatus of claim 8,
wherein the material holder includes:
a transparent plate on one surface of which the photo-curable film is disposed, and through the other surface of which the light reflected through the objective lens is incident; and
a polydimethylsiloxane (PDMS) disposed on the photo-curable film.

10. The apparatus of claim 8,
wherein the material holder includes:
a polydimethylsiloxane (PDMS) on one surface of which the photo-curable film is disposed, and through the other surface of which the light reflected through the objective lens is incident; and
an image sensor disposed on the photo-curable film,
wherein the objective lens adjusts a focus of the reflected light such that an energy of the reflected light passes through the PDMS and is concentrated in a region adjacent to the image sensor.

11. A method for manufacturing a phase mask for lens-less camera, comprising the steps of:
by a 2D map generator including one or more processors, generating a two-dimensional map (2D map) for pre-obtaining a point spread function indicating light intensity for each position to be formed on a 2D imaging plane placed at a focal distance, determining a height for each 2D position that the phase mask to be manufactured has from the pre-obtained point spread function, and generating the 2D map representing the intensity for each 2D position that the reflected light has according to the determined height for each 2D position;
by a digital image mirror, receiving the 2D map, reflecting a light irradiated from a light source with different intensities for each position to output a reflected light; and
irradiating the reflected light to a photo-curable film disposed on a material holder, thereby acquiring the phase mask having a different height for each position depending on the light intensity for each position of the reflected light.

12. The method according to claim 11,
wherein the step of generating the 2D map comprises:
estimating a virtual point spread function by calculating a phase change of a light passing through a virtual phase mask having a height for each position according to a previously set height map, and
updating the height map of the virtual phase mask by reflecting an error between the virtual point spread function and the point spread function as a phase change of light back in reverse direction.

13. The method according to claim 12,
wherein the step of generating the 2D map comprises:
if the error between the virtual point spread function and the point spread function is within a reference error, designating the height map of the virtual phase mask as a height of the phase mask for each 2D position according to the point spread function.

14. The method according to claim 13,
wherein the step of generating the 2D map repeats processes of:
estimating a virtual point spread function, which is an image formed at a position spaced apart by a focal length by light passing through the phase mask, using a phase map indicating the phase change of the light passing through the virtual phase mask based on the height map of the virtual phase mask,
calculating the error between the virtual point spread function and the point spread function,
if the calculated error exceeds the reference error, updating the phase map by calculating the calculated error as a phase change of light in the reverse direction, and
updating the height map of the virtual phase mask based on the updated phase map.

15. The method according to claim 14,
wherein the step of generating the 2D map includes performing filtering such that the phase change between adjacent positions according to the updated phase map is limited, and then convert it into an updated height map.

16. The method according to claim 15,
wherein the step of generating the 2D map includes:
calculating the calculated error as a phase error according to the phase change of light,
normalizing the calculated phase error based on the maximum value of an optical transfer function in which the phase change of the light passing through the phase mask is modeled, and
updating the phase map by compensating the phase map with the normalized phase error.

17. The method according to claim 13,
wherein the step of generating the 2D map includes:

acquiring the 2D map by quantizing a height map designated as a height of the phase mask for each 2D position.

18. The method according to claim 11,
wherein the step of acquiring the phase mask includes:
by an objective lens, concentrating an energy of the reflected light on a designated area of the photo-curable film, so that the photo-curable film is cured, thereby generating the phase mask.

19. The method according to claim 18,
wherein in the step of acquiring the phase mask,
the photo-curable film is disposed on one surface of a transparent plate, and in direction of the other surface of the transparent plate, the reflected light through the objective lens is incident, so that the photo-curable film is cured,
wherein the objective lens adjusts a focus of the reflected light such that the energy of the reflected light is concentrated in a region adjacent to the transparent plate in the photo-curable film.

20. The method according to claim 18,
wherein in the step of acquiring the phase mask,
the reflected light through the objective lens is incident to the photo-curable film disposed between a polydimethylsiloxane (PDMS) and an image sensor, so that the photo-curable film is cured,
wherein the objective lens adjusts a focus of the reflected light such that the energy of the reflected light passes through the PDMS and is concentrated in a region adjacent to the image sensor.

* * * * *